(12) United States Patent
Varghese

(10) Patent No.: US 10,615,069 B2
(45) Date of Patent: Apr. 7, 2020

(54) SEMICONDUCTOR STRUCTURES COMPRISING POLYMERIC MATERIALS

(71) Applicant: Micron Technology, Inc., Boise, ID (US)

(72) Inventor: Sony Varghese, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/667,395

(22) Filed: Aug. 2, 2017

(65) Prior Publication Data

US 2017/0330784 A1 Nov. 16, 2017

Related U.S. Application Data

(62) Division of application No. 14/134,199, filed on Dec. 19, 2013, now Pat. No. 9,761,474.

(51) Int. Cl.
*H01L 21/70* (2006.01)
*H01L 21/683* (2006.01)
(Continued)

(52) U.S. Cl.
CPC ............ *H01L 21/6835* (2013.01); *B32B 7/14* (2013.01); *B32B 37/08* (2013.01);
(Continued)

(58) Field of Classification Search
None
See application file for complete search history.

(56) References Cited

U.S. PATENT DOCUMENTS 5,882,956 A 3/1999 Umehara et al.
6,355,541 B1 3/2002 Holland et al.
(Continued)

FOREIGN PATENT DOCUMENTS

JP 56079437 A 6/1981
JP 57126143 A 8/1982
(Continued)

OTHER PUBLICATIONS

Calleja et al., Where is the glass transition temperature of poly(tetrauoroethylene)? A new approach by dynamic rheometry and mechanical tests, European Polymer Journal, 2013, vol. 49, No. 8, pp. 2214-2222.
(Continued)

*Primary Examiner* — Bradley Smith
(74) *Attorney, Agent, or Firm* — TraskBritt

(57) ABSTRACT

Methods of forming semiconductor structures include providing a polymeric material over a carrier substrate, bonding another substrate to the polymeric material, and lowering a temperature of the polymeric material to below about 15° C. to separate the another substrate from the carrier substrate. Some methods include forming a polymeric material over a first substrate, securing a second substrate to the first substrate over the polymeric material, cooling the polymeric material to a temperature below a glass transition temperature of the polymeric material, and separating the second substrate from the first substrate. Semiconductor structures may include a polymeric material over at least a portion of a first substrate, an adhesive material over the polymeric material, and a second substrate over the adhesive material. The polymeric material may have a glass transition temperature of about 10° C. or lower and a melting point of about 100° C. or greater.

21 Claims, 8 Drawing Sheets

(51) Int. Cl.
  *B32B 37/18* (2006.01)
  *B32B 38/10* (2006.01)
  *H01L 21/78* (2006.01)
  *B32B 37/08* (2006.01)
  *H01L 21/20* (2006.01)
  *B32B 7/14* (2006.01)
  *B32B 37/12* (2006.01)

(52) U.S. Cl.
  CPC .......... *B32B 37/1292* (2013.01); *B32B 37/18* (2013.01); *B32B 38/10* (2013.01); *H01L 21/2007* (2013.01); *H01L 21/78* (2013.01); *B32B 37/12* (2013.01); *B32B 2309/02* (2013.01); *B32B 2457/14* (2013.01); *H01L 21/6836* (2013.01); *H01L 2221/6834* (2013.01); *H01L 2221/68318* (2013.01); *H01L 2221/68327* (2013.01); *H01L 2221/68381* (2013.01); *Y10T 428/265* (2015.01); *Y10T 428/2848* (2015.01)

(56) References Cited

U.S. PATENT DOCUMENTS

| | | |
|---|---|---|
| 7,223,635 B1 | 5/2007 | Brewer |
| 2005/0215029 A1 | 9/2005 | Peng et al. |
| 2010/0289189 A1 | 11/2010 | Lichtensteiger et al. |
| 2010/0330788 A1 | 12/2010 | Yu et al. |
| 2011/0069467 A1 | 3/2011 | Flaim et al. |
| 2012/0028438 A1 | 2/2012 | Richter |
| 2013/0095655 A1 | 4/2013 | Varghese et al. |
| 2014/0015109 A1* | 1/2014 | Lei .......... H01L 21/78 257/618 |
| 2014/0130962 A1* | 5/2014 | Yu .......... H01L 21/187 156/154 |
| 2015/0179493 A1 | 6/2015 | Varghese |

FOREIGN PATENT DOCUMENTS

| | | |
|---|---|---|
| JP | 63248133 A | 10/1988 |
| KR | 100431293 B1 | 5/2004 |

OTHER PUBLICATIONS

Kalpakjian et al., Polymer Properties, Manufacturing Processes for Engineering Materials, 5th ed., 2008, 55 pages.

Rae et al., The properties of poly(tetrafluoroethylene) (PTFE) in compression, Polymer, vol. 45, Sep. 15, 2004, pp. 7615-7625.

* cited by examiner

SEMICONDUCTOR STRUCTURES COMPRISING POLYMERIC MATERIALS

CROSS-REFERENCE TO RELATED APPLICATION

This application is a divisional of U.S. patent application Ser. No. 14/134,199, filed Dec. 19, 2013, now U.S. Pat. No. 9,761,474, issued Sep. 12, 2017, the disclosure of which is hereby incorporated herein in its entirety by this reference.

TECHNICAL FIELD

The present disclosure, in various embodiments, relates generally to materials for removably bonding wafer substrates to carrier substrates during processing of a semiconductor device and to related methods.

BACKGROUND

Semiconductor devices and structures thereof are typically produced on a wafer or other bulk semiconductor substrate, which may be referred to herein as a "device wafer." The array is then singulated into individual semiconductor devices, which may also be characterized as "dice" that are incorporated into a package for practical mechanical and electrical interfacing with higher level packaging, for example, for interconnection with a printed wiring board. Device packaging may be formed on or around the die while it is still part of the wafer. This practice, referred to in the art as wafer-level packaging, reduces overall packaging costs and enables reduction of device size, which may result in faster operation and reduced power demands in comparison to conventionally packaged devices.

Thinning device wafer substrates is commonly performed in semiconductor device manufacture because thinning enables more devices to be stacked in a given height, and helps dissipate heat. However, thinned wafer substrates are fragile and, thus, relatively more difficult to handle than unthinned wafer substrates of the initial wafer thickness without damage to the substrate or to the integrated circuit components thereon. To alleviate some of the difficulties, device wafer substrates are attached to larger and more robust carrier wafers. After processing, the device wafer substrates may be removed from the carrier wafers.

Conventional carrier materials include silicon (e.g., a blank device wafer), soda lime glass, borosilicate glass, sapphire, various metals, and ceramics. The carrier wafers are substantially round and sized to match a size and shape of the device wafer, so that the bonded assembly can be handled in conventional processing tools. Polymeric adhesives used for temporary wafer bonding are conventionally applied by spin coating or spray coating from solution or laminating as dry-film tapes. Spin- and spray-applied adhesives are increasingly preferred because they form coatings with higher thickness uniformity than tapes can provide. Higher thickness uniformity translates into greater control over cross-wafer thickness uniformity after thinning. The polymeric adhesives also exhibit high bonding strength to the device wafer and the carrier wafer.

The polymeric adhesive may be spin-applied onto the device wafer, the carrier wafer, or both. The coated wafer, conventionally the carrier wafer to conserve the thermal budget of the device wafer, is baked to remove all of the coating solvent from the polymeric adhesive. The device wafer and carrier wafer are then placed in contact in a heated mechanical press for bonding through the polymeric adhesive. Sufficient temperature and pressure are applied to cause the adhesive to flow and fill into the device wafer structural features and achieve intimate contact with substantially all mutually adjacent areas of the device wafer and carrier wafer surfaces.

Removal of the device wafer from the carrier wafer after processing is conventionally performed by chemical means (e.g., with a solvent), photodecomposition, thermomechanical means, or thermodecomposition. Each of these methods has drawbacks in production environments. For example, chemical debonding by dissolving the polymeric adhesive is a slow process because the solvent must diffuse over large distances through the polymeric adhesive to effect release. That is, the solvent typically must diffuse from the edge of the bonded substrates, or from a perforation in the carrier wafer, into the local region of the adhesive. In either case, the minimum distance from an exposed surface to a bonded area required for solvent diffusion and penetration is typically at least 3-5 mm and can be much greater, even with perforations to increase solvent contact with the adhesive. Treatment times of several hours, even at elevated temperatures (e.g., greater than 60° C.), are usually utilized for debonding, meaning wafer throughput is low.

Photodecomposition is, likewise, a slow process because the entire bonded substrate cannot generally be exposed at one time. Instead, an exposing light source, such as a laser having a beam cross-section of only a few millimeters, is focused on a small area at a time to deliver sufficient energy to decompose the adhesive bond line. The beam is then scanned (or rastered) across the substrate in a serial fashion to debond the entire surface, which leads to long debonding times and low wafer throughput.

Though thermomechanical debonding can be performed typically in a few minutes, it has other limitations that reduce device yield. Back side processes for temporarily bonded device wafers often involve working temperatures higher than 200° C. or even 300° C. If polymeric adhesives either decompose or soften excessively at or near the working temperature, debonding may occur prematurely. Adhesives are normally selected to soften sufficiently at about 20° C. to about 50° C. above the working temperature of the device wafer. The high temperatures required for debonding such adhesives imposes significant stresses on the bonded wafer pair as a result of thermal expansion. At the same time, the high mechanical force utilized to move the device wafer from the carrier wafer by a sliding, lifting, or twisting motion creates additional stress that can cause the device wafer to break or produce damage within the microscopic integrated circuitry of individual devices of the device wafer, which leads to device failure and yield loss.

Thermodecomposition debonding also tends to cause wafer breakage. Gases are produced when the polymeric adhesive is decomposed, and these gases can become trapped between the device wafer and the carrier wafer before the bulk of the adhesive has been removed. The accumulation of trapped gases can cause the thin device wafer to blister and crack, or even rupture. Another problem with thermodecomposition debonding is that polymer decomposition is often accompanied by the formation of intractable, carbonized residues that cannot be removed from the device wafer by conventional cleaning procedures.

DETAILED DESCRIPTION

Figure 1A:
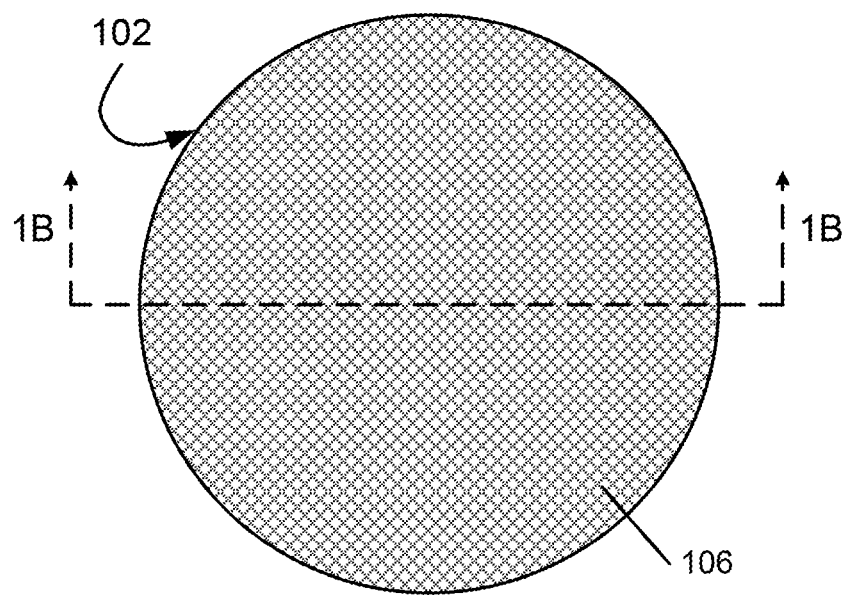
FIGS. 1A, 2A, and 3A are top views of semiconductor structures according to an embodiment of the present disclosure at various stages of processing.

In some embodiments disclosed herein, a method of processing a semiconductor structure includes providing a polymeric material over a carrier substrate, bonding a wafer substrate to the polymeric material, and lowering a temperature of the polymeric material to below about 15° C. to separate the wafer substrate from the carrier substrate. For example, lowering the temperature may cause fracturing of the polymeric material, and the polymeric material may separate from the carrier substrate and/or the wafer substrate with little or no applied force.

As used herein, the terms "wafer substrate" and "device wafer substrate" mean and include a base material or construction upon which components, such as those of memory cells and peripheral circuitry, as well as logic, are formed. Integrated circuitry other than memory-associated circuitry may also be formed, such as processing circuitry, or processing circuitry in combination with memory-associated circuitry may be formed together on dice of the same wafer substrate to produce so-called "system on a chip" (SOC) dice. The disclosure is not limited to wafer substrates bearing any particular type or types of integrated circuitry. The wafer substrate may be a substrate wholly made of a semiconductor material, a base semiconductor material on a supporting structure, or a semiconductor substrate having one or more materials, structures, or regions formed thereon. The wafer substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, wherein x is, for example, a mole fraction between 0.2 and 0.8), germanium (Ge), gallium arsenide (GaAs), gallium nitride (GaN), or indium phosphide (InP), among others. Furthermore, when reference is made to a "wafer substrate" in the following description, previous process stages may have been utilized to form materials, regions, or junctions, as well as connective elements such as lines, plugs, and contacts, in the base semiconductor structure or foundation, such components comprising, in combination, integrated circuitry.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated 90 degrees, inverted, flipped, etc.) and the spatially relative descriptors used herein interpreted accordingly.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" another element, there are no intervening elements present.

As used herein, the terms "comprises," "comprising," "includes," and/or "including" specify the presence of stated features, regions, integers, stages, operations, elements, materials, components, and/or groups, but do not preclude the presence or addition of one or more other features, regions, integers, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

Embodiments are described herein with reference to the illustrations. The illustrations presented herein are not meant to be actual views of any particular material, component, structure, device, or system, but are merely idealized representations that are employed to describe embodiments of the present disclosure. Variations from the shapes of the illustrations as a result, for example, of manufacturing techniques and/or tolerances, are to be expected. Thus, embodiments described herein are not to be construed as being limited to the particular shapes or regions as illustrated, but include deviations in shapes that result, for example, from manufacturing techniques. For example, a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims.

The following description provides specific details, such as material types and processing conditions, in order to provide a thorough description of embodiments of the disclosed compositions, semiconductor structures, and methods. However, a person of ordinary skill in the art will understand that the embodiments of the compositions and methods may be practiced without employing these specific details. Indeed, the embodiments of the compositions and methods may be practiced in conjunction with conventional semiconductor fabrication techniques.

The fabrication processes described herein do not form a complete process flow for processing semiconductor devices. Preceding, intermediary, and final process stages are known to those of ordinary skill in the art. Accordingly, only the methods and semiconductor structures necessary to understand embodiments of the present devices and methods are described herein.

Unless the context indicates otherwise, the materials described herein may be formed by any conventional technique including, but not limited to, dip coating, spin coating, spray coating, blanket coating, chemical vapor deposition ("CVD"), plasma-enhanced CVD, atomic layer deposition ("ALD"), plasma-enhanced ALD, or physical vapor deposition ("PVD"). Alternatively, the materials may be grown in situ, unless the context otherwise indicates. Depending on the specific material to be formed, the technique for applying, depositing, growing, or otherwise forming the material may be selected by a person of ordinary skill in the art.

Reference will now be made to the drawings, where like numerals refer to like components throughout. The drawings are not necessarily to scale.

In some embodiments, a method of processing a semiconductor structure includes providing a polymeric material over a carrier substrate, bonding another substrate to the polymeric material, and lowering a temperature of the polymeric material to separate the another substrate from the carrier substrate.

For example, some methods may include forming a polymeric material over a first substrate, securing a second substrate to the first substrate over the polymeric material, cooling the polymeric material to a temperature below a glass transition temperature of the polymeric material, and separating the second substrate from the first substrate.

Figure 1B:
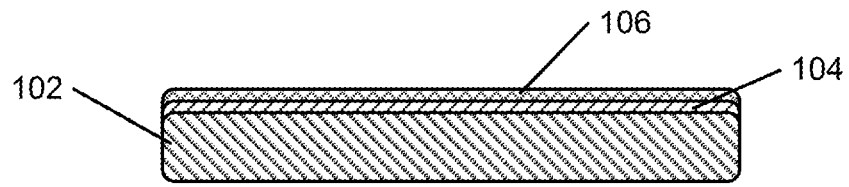
FIGS. 1B, 2B, and 3B are cross-sectional views of the semiconductor structures shown in FIGS. 1A, 2A, and 3A, respectively.

FIGS. 1A and 1B illustrate a simplified schematic of a carrier substrate 102, and a cross-sectional view of the carrier substrate 102 through section 1B-1B, respectively. The carrier substrate 102 has a surface over which a wafer substrate may subsequently be secured, as described in further detail below. A polymeric material 104 may be provided over the carrier substrate 102, such as over the upper surface of the carrier substrate 102. The polymeric material 104 may function as a separator material to induce separation between the carrier substrate 102 and a wafer substrate 108, as described in more detail below.

The polymeric material 104 may be selected to exhibit thermal and chemical properties amenable to subsequent semiconductor processing. For example, the polymeric material 104 may be selected to exhibit a melting point of between about 100° C. and about 500° C., such as at least about 100° C., at least about 200° C., at least about 300° C., or even at least about 400° C. Some subsequent semiconductor processing acts may be carried out at elevated temperatures, and the polymeric material 104 may be selected such that the polymeric material 104 does not melt or degrade during processing. In some embodiments the polymeric material 104 may not melt, but instead may thermally decompose. Such polymeric materials 104 may be selected to exhibit a thermal decomposition temperature of at least about 100° C., at least about 200° C., at least about 300° C., or even at least about 400° C.

Polymeric materials generally exhibit a temperature at which the physical properties of the materials change from a brittle state into a molten or rubber-like state, which temperature is commonly referred to in the art as a "glass transition temperature." Depending on the direction and rate of change of temperature, the point at which the physical properties of some materials change may vary over a range of temperatures, such as a range of a few degrees Celsius. As used herein, the term "glass transition temperature" means and includes the temperature at which a polymeric material reaches a viscosity threshold of $10^{12}$ Pa·s when subjected to a constant cooling rate of 20° C./min.

The polymeric material 104 may be selected to exhibit a glass transition temperature lower than the lowest processing temperature expected to be encountered before eventual removal of the polymeric material 104. That is, at temperatures expected to be encountered during processing, until the removal of the polymeric material 104, the polymeric material 104 may be in its molten or rubber-like state. For example, when subsequent operations include processing wafers at room temperature (e.g., about 20° C.), the polymeric material 104 may be selected to exhibit a glass transition temperature lower than room temperature, such about 10° C. or lower, about 0° C. or lower, about −10° C. or lower, about −20° C. or lower, or even about −40° C. or lower.

The polymeric material 104 may be selected to be compatible with the carrier substrate 102 and other materials that will be in contact therewith. That is, the polymeric material 104 may be unreactive with the carrier substrate 102 and other materials. The polymeric material 104 may be selected to be resistant to wet and/or dry etch chemistries, depending on the subsequent processing expected to be performed. Thus, the polymeric material 104 may remain in place during etching and other processes.

Another polymeric material 106 may be provided over the polymeric material 104 and the carrier substrate 102. In some embodiments, the polymeric material 104 may cover an entire surface of the carrier substrate 102 and the other polymeric material 106 may cover an entire surface of the polymeric material 104. The other polymeric material 106 may be a different material from the polymeric material 104, and may exhibit a melting point and/or glass transition temperature different from that of the polymeric material 104. Thus, the polymeric material 104 and the polymeric material 106 may exhibit different coefficients of thermal expansion. However, the polymeric material 106 may be selected such that the polymeric material 106 does not melt or degrade during processing, and such that its glass transition temperature is lower than the lowest processing temperature expected to be encountered before eventual removal of the polymeric material 106. The polymeric material 106 may be an adhesive formulated to bond the polymeric material 104 to another substrate.

The other polymeric material 106 may be selected to be compatible with the carrier substrate 102, the polymeric material 104, and other materials that will be in contact therewith. That is, the other polymeric material 106 may be unreactive with the carrier substrate 102, the polymeric material 104, and other materials. The other polymeric material 106 may be selected to be resistant to wet and/or dry etch chemistries, depending on the subsequent processing acts expected to be performed. Thus, the other polymeric material 106 may remain in place during etching and other processes. The other polymeric material 106 may be selected to have a melting point of between about 100° C. and about 500° C., such as at least about 100° C., at least about 200° C., at least about 300° C., or even at least about 400° C.

The polymeric materials 104, 106 may be applied over the carrier substrate 102 by conventional techniques. For example, the polymeric materials 104, 106 may each be applied by a spin-coating process or spray-coating process, by adhering a preformed laminate material comprising the two polymeric materials 104, 106, or any other suitable means. Application of polymer materials over surfaces is known in the art and not described in detail herein.

Figure 2A:
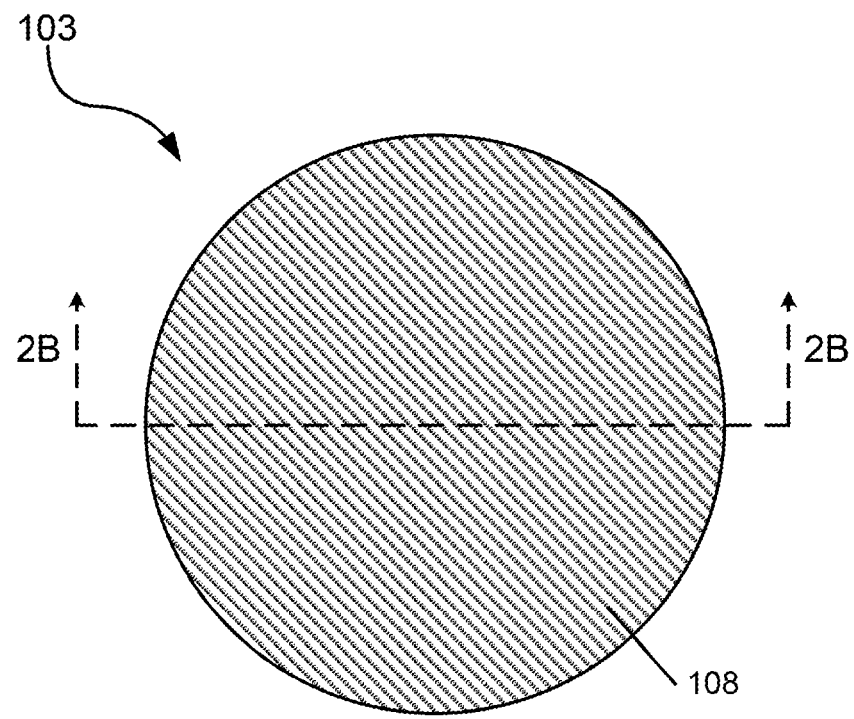
Figure 2B:
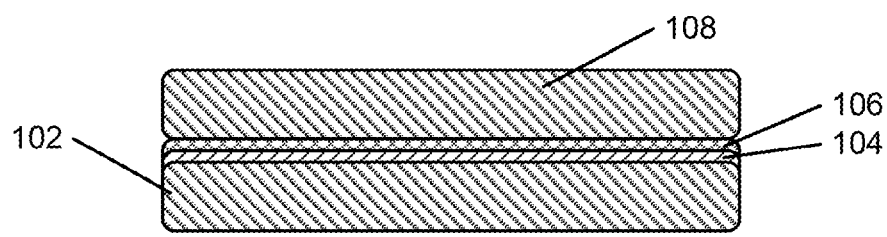

A wafer substrate 108 may be attached to the polymeric material 106, as shown in FIGS. 2A and 2B. FIG. 2A is a simplified schematic of a semiconductor structure 103 including the carrier substrate 102 with the wafer substrate 108 attached, and FIG. 2B is a cross-sectional view of the assembly through section 2B-2B. In some embodiments, the other polymeric material 106 may be applied to the wafer substrate 108 before the wafer substrate 108 is attached to the carrier substrate 102 (instead of or in addition to applying the other polymeric material 106 to the polymeric material 104 over carrier substrate 102). After attachment to the carrier substrate 102, the wafer substrate 108 may be subjected to back side processing by methods known in the art for processing semiconductor substrates. For example, conventional processes may be used to form semiconductor structures such as transistors, capacitors, contacts, traces, lines, vias, interconnects, etc.

Figure 3A:
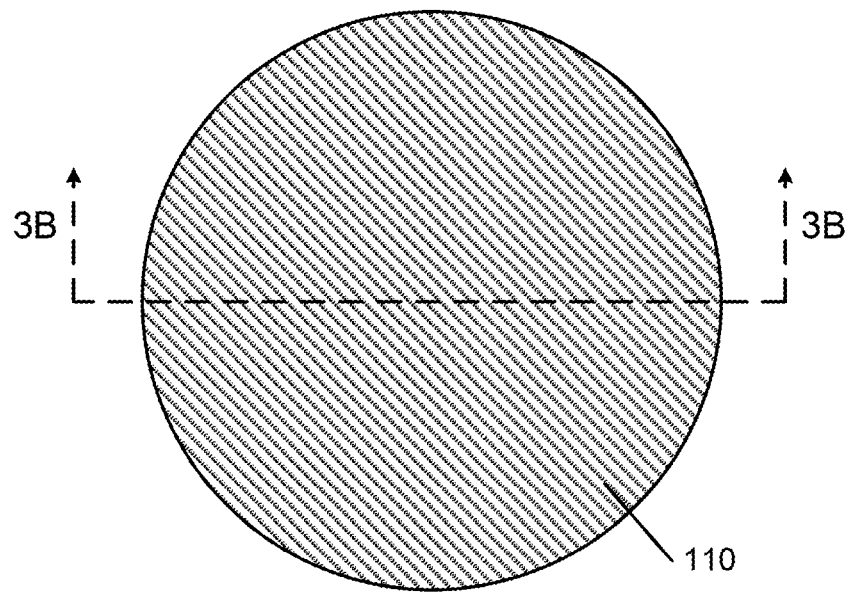
Figure 3B:
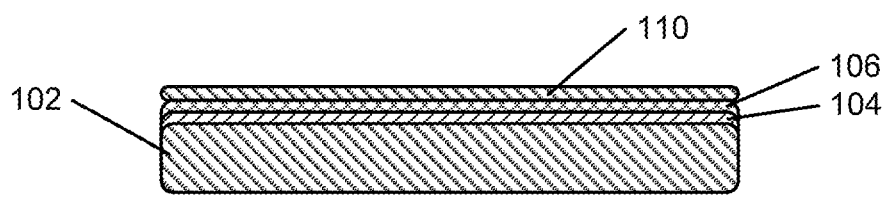

The back side processing may include thinning of the wafer substrate 108 by one or more of back-grinding, wet etching, polishing, or other processes. An initial wafer substrate thickness of, for example, about 600 μm to about 700 μm may be reduced, for example, to about 100 μm or less, to about 200 μm or less, for example, about 50 μm or less. This processing and thinning forms the wafer substrate 108 into what is referred to in the art as a "thinned" wafer substrate 110, as shown in FIGS. 3A and 3B. FIG. 3A is a simplified schematic of the carrier substrate 102 with the thinned wafer substrate 110 attached, and FIG. 3B is a cross-sectional view of the assembly through section 3B-3B. Electrically conductive vias, if present, extend through the thickness of the thinned wafer substrate 110. The thinned wafer substrate 110 may be brought into proximity with another wafer or other substrate. Such a wafer or other substrate may support landing pads with which conductive elements of the thinned wafer substrate 110 may be aligned.

Figure 4:
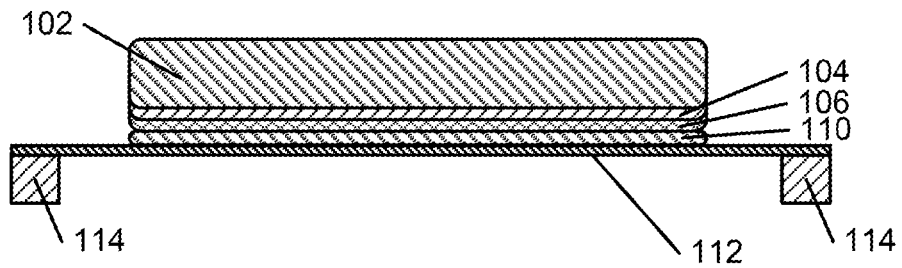
FIGS. 4 through 6 are cross-sectional views of the semiconductor structures shown in FIGS. 1A through 3B at subsequent stages of processing.

The thinned wafer substrate 110 may be removed from the carrier substrate 102 after back side processing to form semiconductor structures. FIG. 4 is a cross-sectional view of the carrier substrate 102, the polymeric materials 104, 106, and the thinned wafer substrate 110 after the thinned wafer substrate 110 has been attached to an optional film 112 carried by a peripheral film frame 114. The film 112, if present, may be configured to handle the thinned wafer substrate 110 without damaging the thinned wafer substrate 110. The thinned wafer substrate 110 may be secured to the film 112 by an adhesive coating the film 112.

Figure 5:
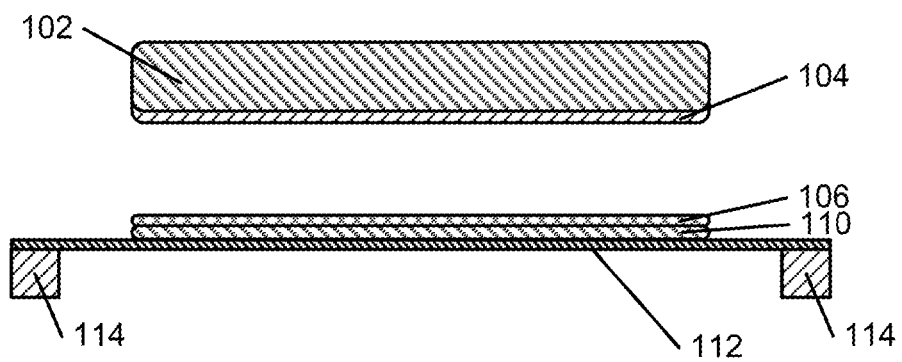

As shown in FIG. 5, the carrier substrate 102 may be separated from the thinned wafer substrate 110, leaving the thinned wafer substrate 110 on the film 112. For example, the temperature of one or more of the polymeric materials 104, 106 may be lowered to cause separation of the carrier substrate 102 from the thinned wafer substrate 110. In some embodiments, the lowered temperature is below the glass transition temperature of one or more of the polymeric materials 104, 106. By controlling a rate of cooling the polymeric materials 104, 106, the polymeric materials 104, 106 may become stiff and/or brittle, and may delaminate from one another, from the carrier substrate 102, and/or from the thinned wafer substrate 110. In some embodiments, the temperature of the polymeric materials 104, 106 may be lowered to a temperature below room temperature, such as below a temperature of about 10° C., a temperature below about 0° C., a temperature below about −10° C., a temperature below about −20° C., or even a temperature below about −40° C. The polymeric materials 104, 106 may be cooled by various methods, such as by passing a chilled fluid (e.g., air, water, alcohol, liquid nitrogen, etc.) adjacent the film 112 or the carrier substrate 102, thermoelectric cooling of the film 112 or the carrier substrate 102, or any other appropriate method. In some embodiments, cooling of the polymeric materials 104, 106 may involve cryogenic cooling (e.g., cooling to about −20° C., −40° C., etc.). At least one of the carrier substrate 102 and the thinned wafer substrate 110 may be cooled to cause the temperature of the polymeric materials 104, 106 to lower. The cooling may induce a temperature gradient across the carrier substrate 102, the polymeric materials 104, 106, and the thinned wafer substrate 110, or the entire semiconductor structure may be cooled to the desired temperature. A cooling system may be used to cool the polymeric materials 104, 106. Suitable cooling systems are known in the art and are not described in detail herein. The cooling system may be selected based on the desired temperature to which the polymeric materials 104, 106 are to be cooled.

In some embodiments, the separation of the polymeric materials 104, 106 may occur without the application of any additional stresses or forces. For instance, the cooling may cause the polymeric material 104 to become stiff and/or brittle, such as by cooling below the glass transition temperature of the polymeric material 104. The cooling may also cause changes in the volume (i.e., shrinkage) of the polymeric material 104. The change in physical properties of the polymeric material 104 may cause the buildup of stress along an interface of the polymeric materials 104, 106, which stress causes delamination of the polymeric materials 104, 106. Thus, the polymeric materials 104, 106 may be separated without damaging the thinned wafer substrate 110. In particular, because the thinned wafer substrate 110 may be very thin, avoiding the need to apply shear or torsional forces to the thinned wafer substrate 110 may decrease the potential for and rate of operational defects, and thus increase efficiency and consequent yield of the processing operations. For example, the carrier substrate 102 may be separated from the thinned wafer substrate 110 by applying a vacuum to the carrier substrate 102 and lifting the carrier substrate 102 straight up, away from the thinned wafer substrate. The carrier substrate 102 and the thinned wafer substrate 110 may be separated without any twisting or sliding of the substrates relative to one another. However, to increase the speed of separation, shear forces or vibration may, optionally, be applied to at least one of the carrier substrate 102 and the thinned wafer substrate 110.

Figure 6:
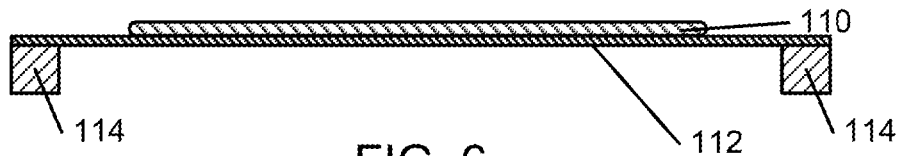

In some embodiments, a portion of the polymeric material 106 and, in some embodiments, a portion of the polymeric material 104, may remain attached to the thinned wafer substrate 110 after separation of the carrier substrate 102 from the thinned wafer substrate 110. Any portion of the polymeric materials 104, 106 remaining on the thinned wafer substrate 110 may be removed by appropriate means, such as by exposure to a solvent. FIG. 6 is a cross-sectional view of the thinned wafer substrate 110 attached to the film 112 supported by film frame 114 after removal of the polymeric materials 104, 106. The thinned wafer substrate 110 may be singulated into a number of semiconductor dice, each die bearing integrated circuitry operably coupled to a number of conductive elements (e.g., bond pads) on a major surface, typically an active surface, thereof. The individual semiconductor dice may then be individually removed from the film 112 and used in subsequent processing operations. In other embodiments, a portion of the polymeric material 106 and a portion of the polymeric material 104 may remain on the carrier substrate 102. The polymeric materials 104, 106 may then be removed from the carrier substrate 102 by conventional techniques, and the carrier substrate 102 reused.

In certain embodiments, the thinned wafer substrate 110 may be diced into a plurality of individual semiconductor dice while connected to the carrier substrate 102. For example, the thinned wafer substrate 110 may be diced to a depth such that the polymeric materials 104 and/or 106 are cut, yet the carrier substrate 102 is not. The semiconductor dice may then be individually removed from the carrier substrate 102 by a pickup head that is cooled, such that the polymeric materials 104, 106 cools to a temperature below its glass transition temperature. For example, the cooled pickup head may operate at a temperature below about 10° C. In such embodiments, the film 112 and film frame 114 shown in FIGS. 4 through 6 may not be used.

In some embodiments, the polymeric material 104 and/or the other polymeric material 106 may be an adhesive material, formulated and configured to adhere to the carrier substrate 102 and/or the wafer substrate 108. For example, the polymeric material 104 and/or the polymeric material 106 may be a thermoset polymer, a thermoplastic polymer, a copolymer, or a blend. Such polymeric materials 104, 106 are commercially available from various sources.

For example, the polymeric materials 104, 106 may include, without limitation, one or more of poly(tetrafluoroethylene), poly-tetrafluoroethylene-alt-ethylene, poly(ethylene terephthalate), poly[(butane-1,4-diol)-alt-(terephthalic acid)], poly{(butane-1,4-diol)-alt-[4,4'-methylenebis(phenyl isocyanate)]}, 2,2,2-trifluoroethanol functionalized poly(dichlorophosphazene), poly[bis(4-fluorophenoxy)phosphazene], 3-(trifluoromethyl)phenol functionalized poly(dichlorophosphazene), p-chlorophenol functionalized poly (dichlorophosphazene), poly[bis(m-methylphenoxy) phosphazene], poly[bis(m-chlorophenoxy)phosphazene], poly[bis(m-fluorophenoxy)phosphazene], poly[bis(m-bromophenoxy)phosphazene], poly(tetrafluoroethylene-co-hexafluoroacetone), poly(hexamethylene carbonate)-block-poly{(p-phenylene diisocyanate)-alt-[bis(4-amino-2,3-dichlorophenyl)methane]}, poly(dimethylsiloxane)-block-poly[(3,4'-oxydianiline)-alt-(adipic acid)], poly{[poly (tetramethylene ether) glycol;butane-1,4-diol]-alt-[2,2'-tetramethylenebis(1,3-dioxoisoindoline-5-carboxylic acid) diethyl ester]}, poly{[alpha-hydro-omega-hydroxypoly(tetrahydrofuran);butane-1,4-diol]-alt-[diethyl 2,2'-(hexane-1, 6-diyl)bis(1,3-dioxoisoindoline-5-carboxylate)]}, poly{[alpha,omega-bis(4-aminobenzoyl)poly(tetramethylene glycol)]-alt-(naphthalene-2,6-dicarbonyl dichloride)}, poly ({[poly(hexano-6-lactone) diol]-alt-[4,4'-methylenebis(phenyl isocyanate)]}-co-{(butane-1,4-diol)-alt-[4,4'-methylenebis(phenyl isocyanate)]}), poly(2-methylprop-1-ene)//polystyrene, polystyrene//poly[ethene-co-(prop-1-ene)], polystyrene//polystyrene-block-(hydrogenated polybutadiene)-block-polystyrene, poly(vinyl alcohol)//poly(epsilon-caprolactone), poly(vinylidene fluoride)//poly-tetrafluoroethylene-alt-ethylene, poly[(butane-1,4-diol)-alt-(terephthalic acid)]//poly[ethene-co-(oct-1-ene)]//poly{ [(bisphenol A)-alt-(terephthalic acid)]-co-[(bisphenol A)-alt-(isophthalic acid)]}, poly[(butane-1,4-diol)-alt-(terephthalic acid)]//poly{[(bisphenol A)-alt-(terephthalic acid)]-co-[(bisphenol A)-alt-(isophthalic acid)]}//poly(ethylene/1-hexylethylene)-poly(2,5-dioxotetrahydrofuran-3,4-diyl), poly(epsilon-caprolactone)//poly(bisphenol A carbonate), or poly[(propane-1,3-diol)-alt-(terephthalic acid)]//poly[ethene-co-(5-ethylidene-2-norbornene)-co-(prop-1-ene)].

Figure 7A:
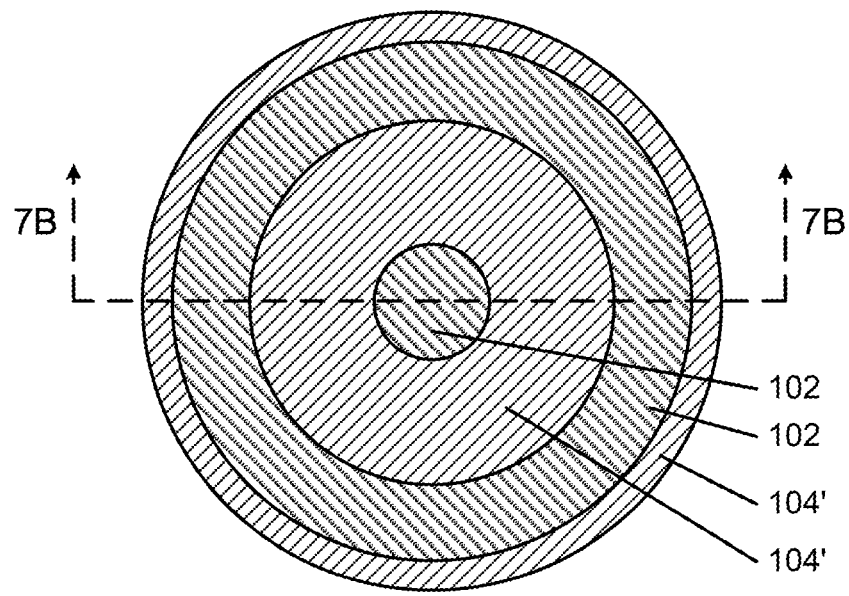
FIGS. 7A, 8A, 9A, and 10A are top views of other semiconductor structures during processing according to an embodiment of the present disclosure.
Figure 7B:
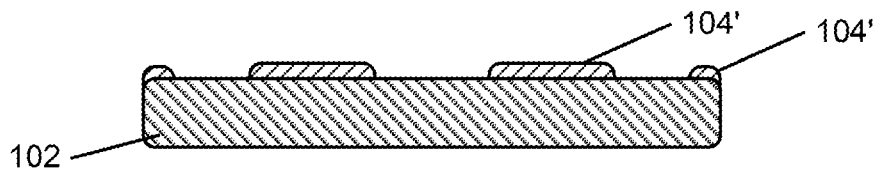
FIGS. 7B, 8B, 9B, and 10B are cross-sectional views of the semiconductor structures shown in FIGS. 7A, 8A, 9A, and 10A, respectively.

While FIGS. 1-6 show the polymeric materials 104, 106 as continuous materials formed on the carrier substrate 102 or the thinned wafer substrate 110, at least one of the polymeric materials 104, 106 may be discontinuous (i.e., patterned). FIGS. 7A through 10B illustrate additional embodiments of how polymeric materials may be provided over substrates where the polymeric material 104 is discontinuous. FIGS. 7A and 7B illustrate a simplified schematic of a carrier substrate 102 and a polymeric material 104', and a cross-sectional view of the carrier substrate 102 and the polymeric material 104' through section 7B-7B, respectively. The polymeric material 104' may be disposed over the carrier substrate 102 in an annular shape comprising concentric rings, such that a central circular and surrounding annular portion of the upper surface of the carrier substrate 102 are free of the polymeric material 104'.

Figure 8A:
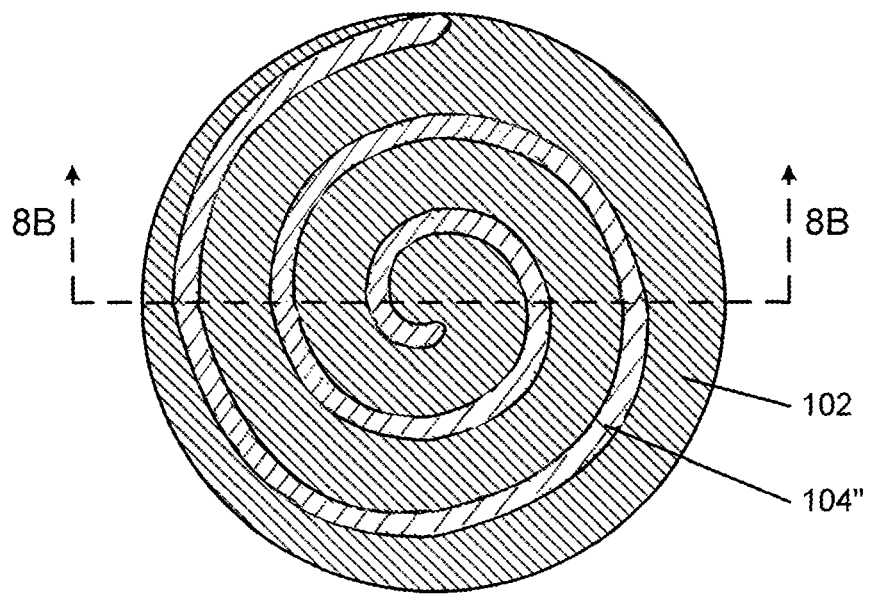
Figure 8B:
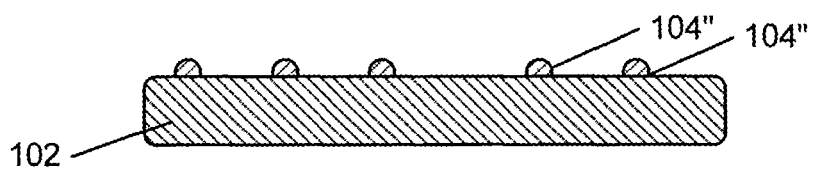

FIGS. 8A and 8B illustrate a simplified schematic of a carrier substrate 102 and a polymeric material 104", and a cross-sectional view of the carrier substrate 102 and the polymeric material 104" through section 8B-8B, respectively. The polymeric material 104" is disposed over the carrier substrate 102 in a spiral shape, such that a spiral-shaped portion of the upper surface of the carrier substrate 102 lying between the spiral-shaped polymeric material 104" is free of the polymeric material 104".

Figure 9A:
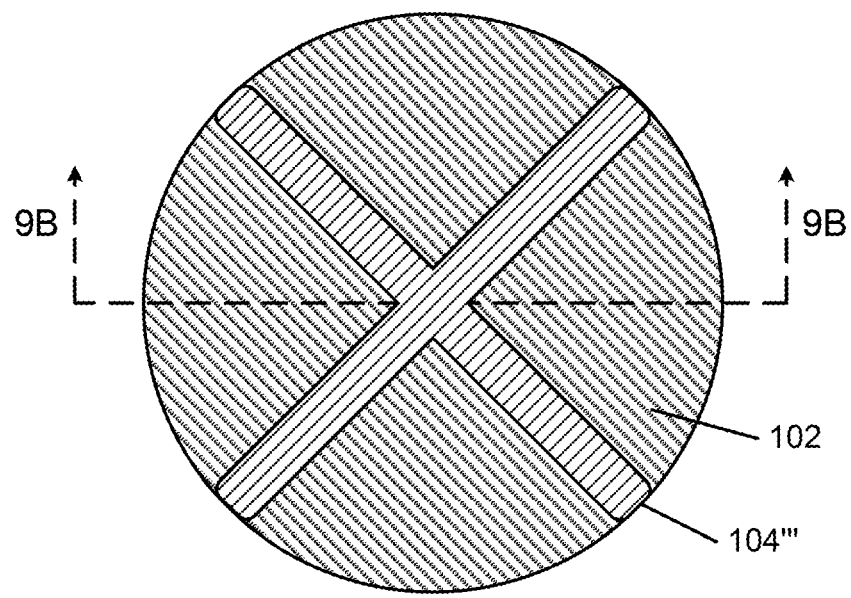
Figure 9B:
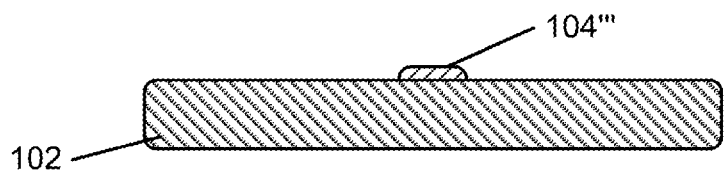

FIGS. 9A and 9B illustrate a simplified schematic of a carrier substrate 102 and a polymeric material 104''', and a cross-sectional view of the carrier substrate 102 and the polymeric material 104''' through section 9B-9B, respectively. The polymeric material 104''' is disposed over the carrier substrate 102 in an X-shaped formation comprising radially extending legs from a center point, such that portions of the upper surface of the carrier substrate 102 configured as wedge-sectors of a circle are free of the polymeric material 104'''. Of course, more radially extending legs of polymeric material 104''' may be employed, and an odd number of legs rather than an even number may also be utilized.

Figure 10A:
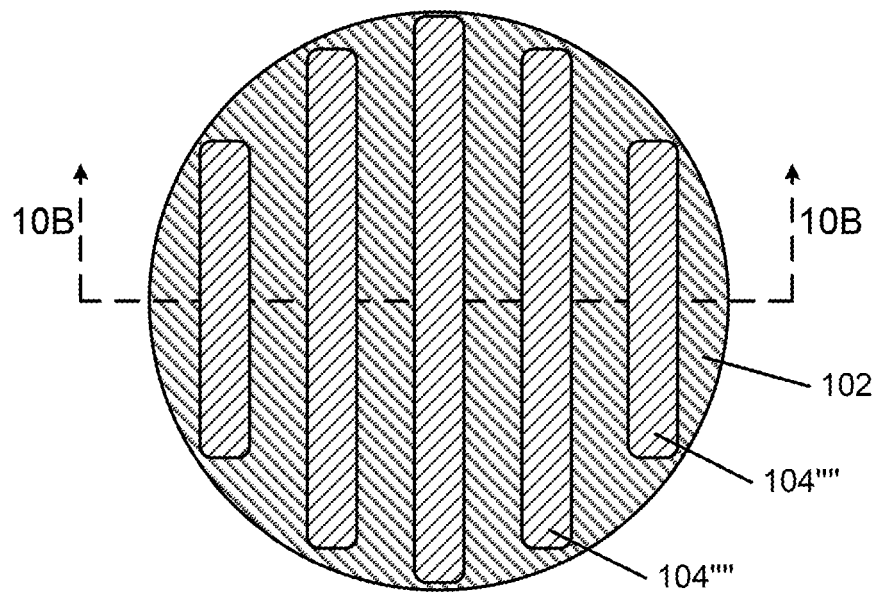
Figure 10B:
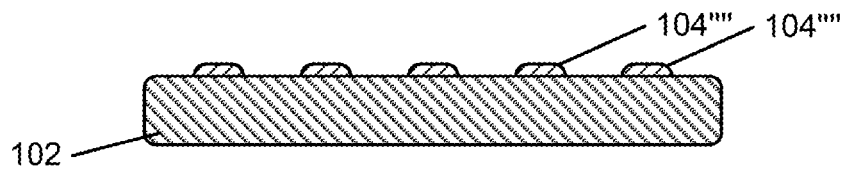

FIGS. 10A and 10B illustrate a simplified schematic of a carrier substrate 102 and a polymeric material 104'''', and a cross-sectional view of the carrier substrate 102 and the polymeric material 104'''' through section 10B-10B, respectively. The polymeric material 104'''' is disposed over the carrier substrate 102 in the shape of strips, such that portions of the upper surface of the carrier substrate 102 between the strips are free of the polymeric material 104''''.

Similarly, the other polymeric material 106 (see FIG. 1B) may be disposed in any appropriate pattern over the carrier substrate 102. In any of the embodiments shown in FIGS. 7A through 10B, or in any other embodiments having a patterned polymeric material, the other polymeric material 106 (see FIG. 1B) may be disposed over the polymeric material 104', 104", 104''', 104'''' and processed as described above with respect to FIGS. 1A through 6. The other polymeric material 106 may have a smooth upper surface to enable bonding to the wafer substrate 108. In some embodiments, the other polymeric material 106 may be applied only to the exposed portion of the carrier substrate 102, such that the polymeric materials 104, 106 together form the surface to which the wafer substrate 108 is secured. The configuration and formulation of the polymeric material 104, 104', 104", 104''', 104'''' may be selected to balance adhesive properties with the ability of the polymeric material 104, 104', 104", 104''', 104'''' and the other polymeric material 106 to release and separate the carrier substrate 102 from the thinned wafer substrate 110 at the appropriate point in processing.

Also disclosed herein are semiconductor structures including a polymeric material over at least a portion of a first substrate, an adhesive material over the polymeric material, and a second substrate over the adhesive material. The polymeric material may exhibit a glass transition temperature of about 10° C. or lower and a melting point of about 100° C. or greater.

For example, as shown in FIGS. 2A and 2B, the semiconductor structure 103 includes the carrier substrate 102, the polymeric material 104, the polymeric material 106 (which may be an adhesive material), and the wafer substrate 108. The adhesive (e.g., the other polymeric material 106) may be adhesively bonded to the wafer substrate 108. The polymeric material 104 may be configured to form a pattern over a surface of the carrier substrate 102, for example, as shown in FIGS. 7A through 10B. The polymeric material 104 may exhibit a melting or decomposition temperature of at least about 100° C., at least about 200° C., at least about 300° C., or even at least about 400° C.

In some embodiments, the other polymeric material 106 may exhibit a glass transition temperature at least 10° C. different from (e.g., lower than) the glass transition temperature of the polymeric material 104. The other polymeric material 106 may have a melting or decomposition temperature of at least about 100° C., at least about 200° C., at least about 300° C., or even at least about 400° C.

The polymeric material 104 and/or the other polymeric material 106 may be formulated to become brittle when cooled to a temperature below about −40° C., below about −20° C., below about 0° C., below about 10° C., or even below about 15° C.

In some embodiments, the semiconductor structure may include the thinned wafer substrate 110 shown in FIGS. 3A and 3B. In such embodiments and as noted above, the thinned wafer substrate 110 may have a thickness of about 200 µm (i.e., 200×10⁻⁶ m) or less, about 100 µm or less, or even about 50 µm or less.

While the embodiments described above include two polymeric materials 104, 106 between the carrier substrate 102 and the thinned wafer substrate 110, a single polymeric material may be used by appropriately selecting the polymeric material to have sufficient differences in brittleness and shrinkage from the carrier substrate 102 and the thinned wafer substrate 110.

While the disclosed device structures and methods are susceptible to various modifications and alternative forms in implementation thereof, specific embodiments have been shown by way of example in the drawings and have been described in detail herein. However, it should be understood that the present disclosure is not intended to be limited to the particular forms disclosed. Rather, the present invention encompasses all modifications, combinations, equivalents, variations, and alternatives falling within the scope of the following appended claims and their legal equivalents.

What is claimed is:

1. A semiconductor structure, comprising:
a polymeric material over at least a portion of a first substrate, the polymeric material exhibiting a glass transition temperature of about −10° C. or lower and a melting point of between about 100° C. and about 405° C., the polymeric material comprising one of poly(tetrafluoroethylene), poly-tetrafluoroethylene-alt-ethylene, poly(ethylene terephthalate), poly[(butane-1,4-diol)-alt-(terephthalic acid)], poly{(butane-1,4-diol)-alt-[4,4'-methylenebis(phenyl isocyanate)]}, 2,2,2-trifluoroethanol functionalized poly(dichlorophosphazene), poly[bis(4-fluorophenoxy) phosphazene], 3-(trifluoromethyl)phenol functionalized poly(dichlorophosphazene), p-chlorophenol functionalized poly(dichlorophosphazene), poly[bis(m-methylphenoxy)phosphazene], poly[bis(m-chlorophenoxy)phosphazene], poly[bis(m-fluorophenoxy)phosphazene], poly[bis(m-bromophenoxy)phosphazene], poly(tetrafluoroethylene-co-hexafluoroacetone), poly(hexamethylene carbonate)-block-poly{(p-phenylene diisocyanate)-alt-[bis(4-amino-2,3-dichlorophenyl)methane]}, poly(dimethylsiloxane)-block-poly[(3,4'-oxydianiline)-alt-(adipic acid)], poly{[poly(tetramethylene ether) glycol; butane-1,4-diol]-alt-[2,2'-tetramethylenebis(1,3-dioxoisoindoline-5-carboxylic acid) diethyl ester]}, poly{[alpha-hydro-omega-hydroxypoly(tetrahydrofuran);butane-1,4-diol]-alt-[diethyl 2,2'-(hexane-1,6-diyl)bis(1,3-dioxoisoindoline-5-carboxylate)]}, poly{[alpha,omega-bis(4-aminobenzoyl)poly(tetramethylene glycol)]-alt-(naphthalene-2,6-dicarbonyl dichloride)}, poly({[poly(hexano-6-lactone) diol]-alt-[4,4'-methylenebis(phenyl isocyanate)]}-co-{(butane-1,4-diol)-alt-[4,4'-methylenebis(phenyl isocyanate)]}), poly(2-methylprop-1-ene)//polystyrene, polystyrene//poly[ethene-co-(prop-1-ene)], polystyrene//polystyrene-block-(hydrogenated polybutadiene)-block-polystyrene, poly(vinyl alcohol)//poly(epsilon-caprolactone), poly(vinylidene fluoride)//poly-tetrafluoroethylene-alt-ethylene, poly[(butane-1,4-diol)-alt-(terephthalic acid)]//poly[ethene-co-(oct-1-ene)]//poly{[(bisphenol A)-alt-(terephthalic acid)]-co-[(bisphenol A)-alt-(isophthalic acid)]}, poly[(butane-1,4-diol)-alt-(terephthalic acid)]//poly{[(bisphenol A)-alt-(terephthalic acid)]-co-[(bisphenol A)-alt-(isophthalic acid)]}//poly(ethylene/1-hexylethylene)-poly(2,5-dioxotetrahydrofuran-3,4-diyl), poly(epsilon-caprolactone)//poly(bisphenol A carbonate), or poly[(propane-1,3-diol)-alt-(terephthalic acid)]//poly[ethene-co-(5-ethylidene-2-norbornene)-co-(prop-1-ene)];
an adhesive material over the polymeric material, the adhesive material exhibiting a glass transition temperature of about −10° C. or lower, a melting point of between about 100° C. and about 405° C., and a different coefficient of thermal expansion than the polymeric material, the adhesive material comprising another of poly(tetrafluoroethylene), poly-tetrafluoroethylene-alt-ethylene, poly(ethylene terephthalate), poly[(butane-1,4-diol)-alt-(terephthalic acid)], poly{(butane-1,4-diol)-alt-[4,4'-methylenebis(phenyl isocyanate)]}, 2,2,2-trifluoroethanol functionalized poly(dichlorophosphazene), poly[bis(4-fluorophenoxy) phosphazene], 3-(trifluoromethyl)phenol functionalized poly(dichlorophosphazene), p-chlorophenol functionalized poly(dichlorophosphazene), poly[bis(m-methylphenoxy)phosphazene], poly[bis(m-chlorophenoxy)phosphazene], poly[bis(m-fluorophenoxy)phosphazene], poly[bis(m-bromophenoxy)phosphazene], poly(tetrafluoroethylene-co-hexafluoroacetone), poly(hexamethylene carbonate)-block-poly{(p-phenylene diisocyanate)-alt-[bis(4-amino-2,3-dichlorophenyl)methane]}, poly(dimethylsiloxane)-block-poly[(3,4'-oxydianiline)-alt-(adipic acid)], poly{[poly(tetramethylene ether) glycol; butane-1,4-diol]-alt-[2,2'-tetramethylenebis(1,3-dioxoisoindoline-5-carboxylic acid) diethyl ester]}, poly{[alpha-hydro-omega-hydroxypoly(tetrahydrofuran);butane-1,4-diol]-alt-[diethyl 2,2'-(hexane-1,6-diyl)bis(1,3-dioxoisoindoline-5-carboxylate)]}, poly{[alpha,omega-bis(4-aminobenzoyl)poly(tetramethylene glycol)]-alt-(naphthalene-2,6-dicarbonyl dichloride)}, poly({[poly(hexano-6-lactone) diol]-alt-[4,4'-methylenebis(phenyl isocyanate)]}-co-{(butane-1,4-diol)-alt-[4,4'-methylenebis(phenyl isocyanate)]}), poly(2-methylprop-1- ene)//polystyrene, polystyrene//poly[ethene-co-(prop-1-ene)], polystyrene//polystyrene-block-(hydrogenated polybutadiene)-block-polystyrene, poly(vinyl alcohol)//poly(epsilon-caprolactone), poly(vinylidene fluoride)//poly-tetrafluoroethylene-alt-ethylene, poly[(butane-1,4-diol)-alt-(terephthalic acid)]//poly[ethene-co-(oct-1-ene)]//poly{[(bisphenol A)-alt-(terephthalic acid)]-co-[(bisphenol A)-alt-(isophthalic acid)]}, poly[(butane-1,4-diol)-alt-(terephthalic acid)]//poly{[(bisphenol A)-alt-(terephthalic acid)]-co-[(bisphenol A)-alt-(isophthalic acid)]}//poly(ethylene/1-hexylethylene)-poly(2,5-dioxotetrahydrofuran-3,4-diyl), poly(epsilon-caprolactone)//poly(bisphenol A carbonate), or poly[(propane-1,3-diol)-alt-(terephthalic acid)]//poly[ethene-co-(5-ethylidene-2-norbornene)-co-(prop-1-ene)]; and a second substrate over the adhesive material.

2. The semiconductor structure of claim 1, wherein the polymeric material exhibits a melting point between about 200° C. and about 405° C.

3. The semiconductor structure of claim 1, wherein the adhesive material is bonded to the second substrate.

4. The semiconductor structure of claim 1, wherein the polymeric material comprises a material formulated to become brittle when cooled to a temperature below about −10° C.

5. The semiconductor structure of claim 1, wherein at least one of the first substrate and the second substrate has a thickness of about 100 μm or less.

6. The semiconductor structure of claim 1, wherein the polymeric material comprises a pattern over the first substrate.

7. The semiconductor structure of claim 1, wherein the first substrate comprises a semiconductor wafer.

8. The semiconductor structure of claim 1, wherein the first substrate comprises integrated circuitry, memory cells, or peripheral circuitry.

9. The semiconductor structure of claim 1, wherein the second substrate comprises a carrier substrate.

10. A semiconductor structure, comprising:
a polymeric material over at least a portion of a first substrate;
an adhesive material over the polymeric material, each of the polymeric material and the adhesive material exhibiting a glass transition temperature of about 10° C. or lower, a melting point of between about 100° C. and about 500° C., and a different coefficient of thermal expansion, each of the polymeric material and the adhesive material comprising a different material selected from the group consisting of poly(tetrafluoroethylene), poly-tetrafluoroethylene-alt-ethylene, poly(ethylene terephthalate), poly[(butane-1,4-diol)-alt-(terephthalic acid)], poly{(butane-1,4-diol)-alt-[4,4'-methylenebis(phenyl isocyanate)]}, 2,2,2-trifluoroethanol functionalized poly(dichlorophosphazene), poly[bis(4-fluorophenoxy)phosphazene], 3-(trifluoromethyl)phenol functionalized poly(dichlorophosphazene), p-chlorophenol functionalized poly(dichlorophosphazene), poly[bis(m-methylphenoxy)phosphazene], poly[bis(m-chlorophenoxy)phosphazene], poly[bis(m-fluorophenoxy)phosphazene], poly[bis(m-bromophenoxy)phosphazene], poly(tetrafluoroethylene-co-hexafluoroacetone), poly(hexamethylene carbonate)-block-poly{(p-phenylene diisocyanate)-alt-[bis(4-amino-2,3-dichlorophenyl)methane]}, poly(dimethylsiloxane)-block-poly[(3,4'-oxydianiline)-alt-(adipic acid)], poly{[poly(tetramethylene ether) glycol; butane-1,4-diol]-alt-[2,2'-tetramethylenebis(1,3-dioxoisoindoline-5-carboxylic acid) diethyl ester]}, poly{[alpha-hydro-omega-hydroxypoly(tetrahydrofuran); butane-1,4-diol]-alt-[diethyl 2,2'-(hexane-1,6-diyl)bis(1,3-dioxoisoindoline-5-carboxylate)]}, poly{[alpha, omega-bis(4-aminobenzoyl)poly(tetramethylene glycol)]-alt-(naphthalene-2,6-dicarbonyl dichloride)}, poly({[poly(hexano-6-lactone) diol]-alt-[4,4'-methylenebis(phenyl isocyanate)]}-co-{(butane-1,4-diol)-alt-[4,4'-methylenebis(phenyl isocyanate)]}), poly(2-methylprop-1-ene)//polystyrene, polystyrene//poly[ethene-co-(prop-1-ene)], polystyrene//polystyrene-block-(hydrogenated polybutadiene)-block-polystyrene, poly(vinyl alcohol)//poly(epsilon-caprolactone), poly(vinylidene fluoride)//poly-tetrafluoroethylene-alt-ethylene, poly[(butane-1,4-diol)-alt-(terephthalic acid)]//poly[ethene-co-(oct-1-ene)]//poly{[(bisphenol A)-alt-(terephthalic acid)]-co-[(bisphenol A)-alt-(isophthalic acid)]}, poly[(butane-1,4-diol)-alt-(terephthalic acid)]//poly{[(bisphenol A)-alt-(terephthalic acid)]-co-[(bisphenol A)-alt-(isophthalic acid)]}//poly(ethylene/1-hexylethylene)-poly(2,5-dioxotetrahydrofuran-3,4-diyl), poly(epsilon-caprolactone)//poly(bisphenol A carbonate), and poly[(propane-1,3-diol)-alt-(terephthalic acid)]//poly[ethene-co-(5-ethylidene-2-norbornene)-co-(prop-1-ene)]; and a second substrate over the adhesive material.

11. The semiconductor structure of claim 10, wherein the adhesive material exhibits a glass transition temperature at least 10° C. different from the glass transition temperature of the polymeric material.

12. The semiconductor structure of claim 10, wherein the polymeric material comprises a material formulated to become brittle when cooled to a temperature below about 0° C.

13. The semiconductor structure of claim 10, wherein the polymeric material contacts an entire surface of the first substrate.

14. The semiconductor structure of claim 10, wherein the polymeric material comprises concentric rings over the first substrate.

15. The semiconductor structure of claim 10, wherein the polymeric material comprises a spiral shape over the first substrate.

16. The semiconductor structure of claim 10, wherein the polymeric material comprises radially extending segments from a center point of the first substrate.

17. The semiconductor structure of claim 10, wherein the polymeric material comprises strips over the first substrate.

18. The semiconductor structure of claim 10, wherein at least one of the first substrate or the second substrate has a thickness of about 200 μm or less.

19. The semiconductor structure of claim 10, wherein at least one of the first substrate or the second substrate has a thickness of about 50 μm or less.

20. The semiconductor structure of claim 10, wherein the adhesive material comprises a discontinuous adhesive material over the polymeric material.

21. A semiconductor structure formed by a process comprising:
forming a polymeric material over a first substrate and forming an adhesive material over the polymeric material, the polymeric material and the adhesive material exhibiting a melting point of between about 100° C. and about 500° C., a glass transition temperature of about 10° C. or lower, and different coefficients of thermal expansion, each of the polymeric material and the adhesive material selected from the group consisting of poly(tetrafluoroethylene), poly-tetrafluoroethylene-alt-ethylene, poly(ethylene terephthalate), poly[(butane-1,4-diol)-alt-(terephthalic acid)], poly{(butane-1,4-diol)-alt-[4,4'-methylenebis(phenyl isocyanate)]}, 2,2,2-trifluoroethanol functionalized poly(dichlorophosphazene), poly[bis(4-fluorophenoxy)phosphazene], 3-(trifluoromethyl)phenol functionalized poly(dichlorophosphazene), p-chlorophenol functionalized poly(dichlorophosphazene), poly[bis(m-methylphenoxy)phosphazene], poly[bis(m-chlorophenoxy)phosphazene], poly[bis(m-fluorophenoxy)phosphazene], poly[bis(m-bromophenoxy)phosphazene], poly(tetrafluoroethylene-co-hexafluoroacetone), poly(hexamethylene carbonate)-block-poly{(p-phenylene diisocyanate)-alt-[bis(4-amino-2,3-dichlorophenyl)methane]}, poly(dimethylsiloxane)-block-poly[(3,4'-oxydianiline)-alt-(adipic acid)], poly{[poly(tetramethylene ether) glycol; butane-1,4-diol]-alt-[2,2'-tetramethylenebis(1,3-dioxoisoindoline-5-carboxylic acid) diethyl ester]}, poly{[alpha-hydro-omega-hydroxypoly(tetrahydrofuran);butane-1,4-diol]-alt-[diethyl 2,2'-(hexane-1,6-diyl)bis(1,3-dioxoisoindoline-5-carboxylate)]}, poly{[alpha,omega-bis(4-aminobenzoyl)poly(tetramethylene glycol)]-alt-(naphthalene-2,6-dicarbonyl dichloride)}, poly({[poly(hexano-6-lactone) diol]-alt-[4,4'-methylenebis(phenyl isocyanate)]}-co-{(butane-1,4-diol)-alt-[4,4'-methylenebis(phenyl isocyanate)]}), poly(2-methylprop-1-ene)//polystyrene, polystyrene//poly[ethene-co-(prop-1-ene)], polystyrene//polystyrene-block-(hydrogenated polybutadiene)-block-polystyrene, poly(vinyl alcohol)//poly(epsilon-caprolactone), poly(vinylidene fluoride)//poly-tetrafluoroethylene-alt-ethylene, poly[(butane-1,4-diol)-alt-(terephthalic acid)]//poly[ethene-co-(oct-1-ene)]//poly{[(bisphenol A)-alt-(terephthalic acid)]-co-[(bisphenol A)-alt-(isophthalic acid)]}, poly[(butane-1,4-diol)-alt-(terephthalic acid)]//poly{[(bisphenol A)-alt-(terephthalic acid)]-co-[(bisphenol A)-alt-(isophthalic acid)]}//poly(ethylene/1-hexylethylene)-poly(2,5-dioxotetrahydrofuran-3,4-diyl), poly(epsilon-caprolactone)//poly(bisphenol A carbonate), and poly[(propane-1,3-diol)-alt-(terephthalic acid)]//poly[ethene-co-(5-ethylidene-2-norbornene)-co-(prop-1-ene)]; and attaching a second substrate to the first substrate over the adhesive material.

\* \* \* \* \*